(12) United States Patent  
Flanigan

(10) Patent No.: US 6,508,062 B2
(45) Date of Patent: Jan. 21, 2003

(54) THERMAL EXCHANGER FOR A WAFER CHUCK

(75) Inventor: Allen Flanigan, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 10 days.

(21) Appl. No.: 09/775,382

(22) Filed: Jan. 31, 2001

(65) Prior Publication Data

US 2002/0100282 A1 Aug. 1, 2002

(51) Int. Cl.[7] ............................. F25B 21/02; F25D 25/00
(52) U.S. Cl. .................... 62/3.2; 62/3.3; 62/259.2; 62/62
(58) Field of Search ..................... 62/3.2, 3.3, 3.7, 62/259.2, 62

(56) References Cited

U.S. PATENT DOCUMENTS

| | | | | |
|---|---|---|---|---|
| 3,719,052 A | | 3/1973 | White ........................... 62/3 |
| 4,432,635 A | * | 2/1984 | Mayer .......................... 355/30 |
| 5,029,445 A | | 7/1991 | Higgins ........................ 62/3.2 |
| 5,061,630 A | | 10/1991 | Knopf et al. ................. 435/290 |
| 5,134,436 A | | 7/1992 | Fujioka ........................ 355/30 |
| 5,154,661 A | | 10/1992 | Higgins ........................ 62/3.3 |
| 5,269,146 A | | 12/1993 | Kerner ......................... 62/3.6 |
| 5,450,726 A | | 9/1995 | Higgins ........................ 62/3.4 |
| 5,456,081 A | * | 10/1995 | Chrysler et al. ............... 62/3.7 |
| 5,522,215 A | | 6/1996 | Matsunaga et al. ............. 62/3.2 |
| 5,613,364 A | | 3/1997 | Higgins ........................ 62/3.2 |
| 5,667,622 A | | 9/1997 | Hasegawa et al. ............. 156/345 |
| 5,671,117 A | | 9/1997 | Sherstinsky et al. ........... 361/234 |
| 5,728,253 A | | 3/1998 | Saito et al. ................... 156/345 |
| 5,740,016 A | | 4/1998 | Dhindsa ....................... 361/704 |
| 5,802,856 A | * | 9/1998 | Schaper et al. ................ 62/3.7 |
| 5,996,353 A | * | 12/1999 | Maxwell et al. ............... 62/3.2 |

OTHER PUBLICATIONS

U.S. Ser. No. 09/707,043, filed Nov. 6, 2000.

* cited by examiner

Primary Examiner—William C Doerrler
(74) Attorney, Agent, or Firm—Moser, Patterson & Sheridan

(57) ABSTRACT

A thermal exchanger assembly for a wafer chuck and method of use therefor is disclosed. More particularly, complimentary manifolds, each having a plurality of fins, are positioned with respect to one another to provide interleaved spaced-apart fins. At least one thermo-electric device is disposed between alternating pairs of fins. The thermo-electric device is coupled to the fins to provide a thermally conductive path from one manifold to the other through the thermo-electric device. The thermal exchanger assembly may be located in a process chamber for processing a wafer, including but not limited to a semiconductor wafer.

21 Claims, 6 Drawing Sheets

THERMAL EXCHANGER FOR A WAFER CHUCK

BACKGROUND OF THE DISCLOSURE

1. Field of the Invention

The present invention relates generally to method and apparatus for semiconductor processing, and more particularly to thermal exchanger assembly for a wafer chuck assembly.

2. Description of the Background Art

In semiconductor wafer processing, the wafer is conventionally maintained within a desired temperature range. Though this may involve regulating temperature in a process chamber, it conventionally involves controlling the temperature of the wafer.

Others have addressed wafer temperature control by providing chilled water through a wafer support pedestal. By cooling the wafer support pedestal, the wafer resting on a wafer chuck is cooled as well. However, this approach is time consuming, and conventionally response times are limited to approximately 2 minutes per degree. Because of the time required for chilled water to take effect, compensation times may be too long for rapid thermal processing or other processing causing rapid wafer temperature changes.

Others have suggested using thermo-electric devices. These devices are disposed under a support surface supporting the wafer in an oriented planar array. However, temperature gradients form between such thermo-electric devices and cause variation across the wafer. Additionally, a planar array of thermo-electric devices is limited to surface area under the support surface.

To address these limitations, others have suggested attaching at least one thermo-electric device to a stem, which is attached to a platen. However, stem length may be limited in some process chambers. Accordingly, it would be desirable to provide a solution having more available surface area within a confined volume for attaching at least one thermo-electric device.

SUMMARY OF THE INVENTION

An aspect of the present invention comprises a thermal exchanger assembly for a wafer chuck assembly. The thermal exchanger assembly comprises a first manifold having a first set of radially positioned fins, and a second manifold having a second set of radially positioned fins. The first and second set of radially positioned fins interleaved with one another to provide spaced-apart pairs of fins. At least one thermo-electric device is alternately located between and in thermal communication with the pairs of fins.

Another aspect of the present invention is a thermal exchanger assembly at least partially located in a process chamber of a processing system. These and other aspects of the present invention will be more apparent from the following description.

BRIEF DESCRIPTION OF THE DRAWINGS

The teachings of the present invention can be readily understood by considering the following detailed description in conjunction with the accompanying drawings, in which.

DETAILED DESCRIPTION

Process System

Figure 1:
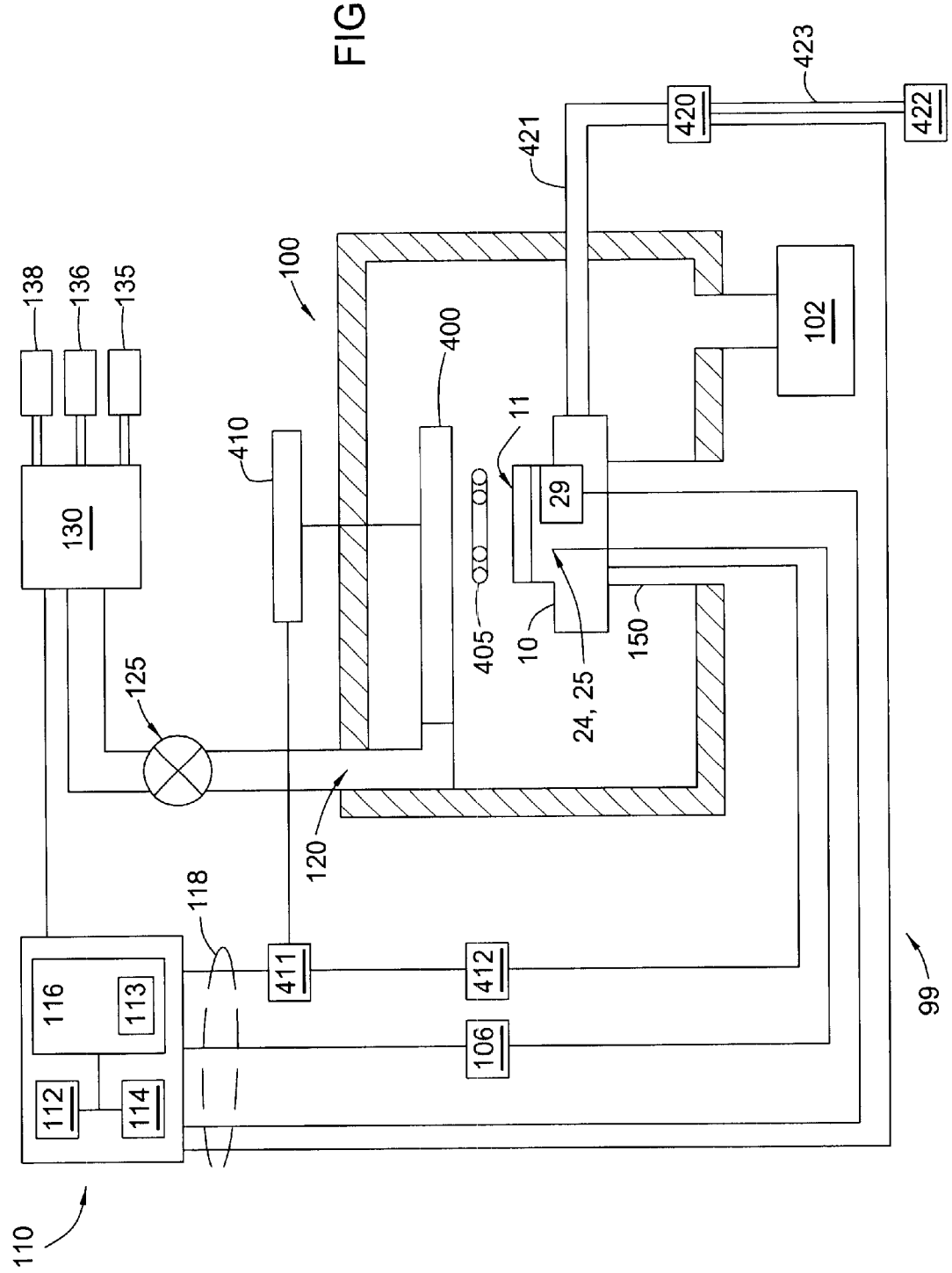
FIG. 1 depicts a schematic and cross-sectional view of an exemplary portion of a processing system having a thermal exchanger assembly.

Referring to FIG. 1, there is illustratively shown an exemplary embodiment of a process system 99 in accordance with an aspect of the present invention. Process system 99 comprises process chamber 100. Process chamber 100 generally houses a support pedestal 150. Susceptor or wafer chuck assembly 10 comprises a portion of support pedestal 150. Wafer chuck assembly 10 may be an electrostatic chuck. Wafer chuck assembly 10, which is used to support a substrate such as a wafer 11 within process chamber 100. Depending on process requirements, wafer 11 can be heated or cooled to some desired temperature or within some desired temperature range. For purposes of clarity, wafer 11 refers to any work piece upon which film processing is performed. Depending on processing stage, wafer 11 may be a silicon semiconductor wafer, or other material layer, which has been formed on wafer 11.

In chamber 100, wafer chuck assembly 10 is heated or cooled by applying an electric current from power supply 106 to thermo-electric devices 20 (shown in FIG. 2). Thermo-electric devices 20 (shown in FIG. 2) draw (subtract) or supply (add) thermal energy depending on direction of current flow of power supply 106. Accordingly, a thermo-electric device may take advantage of a Peltier effect. Wafer 11 may be heated or cooled to within a desired process temperature range of about −40° C. to about 200° C., subject to properties of materials used in assembly 98 of FIG. 2.

Additionally, wafer chuck assembly 10 may be heated or cooled by supplying a thermal medium, such as a liquid through piping 421 from pump and reservoir 420. Pump and reservoir 420 may be coupled via piping 423 to a heater or chiller 422 for supplying or removing thermal energy to such a thermal medium.

Temperature sensor 29, such as a thermocouple, may be attached to or embedded in wafer chuck assembly 10 to monitor temperature in a conventional manner. For example, measured temperature may be used in a feedback loop to control electric current applied to thermo-electric devices 20 from power supply 106, such that wafer temperature can be maintained or controlled at a desired temperature or within a desired temperature range suitable for a process application. Control unit 110 may be used to receive a signal from temperature sensor 29 and control power supply 106 in response.

Vacuum pump 102 is used to evacuate process gases from process chamber 100 and to help maintain a desired pressure or desired pressure within a pressure range inside chamber 100. Orifice 120 through a wall of chamber 100 is used to introduce process gases into process chamber 100. Sizing of orifice 120 conventionally depends on the size of process chamber 100.

Chamber 100 is coupled to gas panel 130 via orifice 120 in part by valve 125. Gas panel 130 is configured to receive and then provide a resultant process gas from two or more gas sources 135, 136 to process chamber 100 through orifice 120 and valve 125. Gas panel 130 is further configured to receive and then provide a purge gas from purge gas source 138 to process chamber 100 through orifice 120 and valve 125.

Control unit 110, such as a programmed personal computer, work station computer, and the like, is configured to control flow of various process gases through gas panel 130 as well as valve 125 during different stages of a wafer process sequence. Illustratively, control unit 110 comprises central processing unit (CPU) 112, support circuitry 114, and memory 116 containing associated control software 113. In addition to control of process gases through gas panel 130, control unit 110 may be configured to be responsible for automated control of other activities used in wafer processing—such as wafer transport, temperature control, chamber evacuation, among other activities, some of which are described elsewhere herein.

Control unit 110 may be one of any form of general purpose computer processor that can be used in an industrial setting for controlling various chambers and sub-processors. CPU 112 may use any suitable memory 116, such as random access memory, read only memory, floppy disk drive, hard disk, or any other form of digital storage, local or remote. Various support circuits may be coupled to CPU 112 for supporting system 10. Software routines 113 as required may be stored in memory 116 or executed by a second computer processor that is remotely located (not shown). Bi-directional communications between control unit 110 and various other components of wafer processing system 10 are handled through numerous signal cables collectively referred to as signal buses 118, some of which are illustrated in FIG. 1.

Process system 99 comprises RF power supplies 410 and 412, showerhead 400, gas source 405, and matching network(s) 411. Notably, process system 99 may be configured for physical vapor deposition (PVD) or chemical vapor deposition (CVD). More particularly, process system 99 may be used for PVD "subzero" deposition of copper, where wafer chuck assembly 10 is cooled for cooling substrate structure 11 to temperatures from about −20° C. to about 0° C.

Showerhead 400 and wafer support pedestal 150 provide in part spaced apart electrodes. An electric field may be generated between these electrodes to ignite a process gas introduced into chamber 100 to provide plasma 405.

Conventionally, pedestal 150 is coupled to a source of radio frequency (RF) power source 412 through a matching network 411, which in turn may be coupled to control unit 110. Alternatively, RF power source 410 may be coupled to showerhead 400 and matching network 411, which in turn may be coupled to control unit 110. Moreover, matching network 411 may comprise different circuits for RF power sources 410 and 412, and both RF power sources 410 and 412 may be coupled to showerhead 400 and pedestal 150, respectively.

Wafer Chuck Assembly

Referring to FIG. 2, there is illustratively shown several exemplary embodiments of wafer chuck assembly 10. Wafer chuck assembly 10 comprises a platen 12, a thermal exchanger assembly 98, and a manifold 15.

Manifold 15 comprises at least one conduit 16 having at least one inlet and at least one outlet. However, manifold 15 may comprise one or more inlets and a plurality of outlets and conduits 16. Manifold 15 may be a separate work piece as illustratively shown in FIGS. 2A and 2B, or integrally formed with manifold 14, as illustratively shown in FIG. 2C.

Thermal exchanger assembly 98 comprises a manifold 14, a plurality of thermo-electric devices 20, and a manifold 13. Manifold 14 comprises base 14B and a plurality of fins 14F. Manifold 13 comprises base 13B and a plurality of fins 13F. Fins 13F and 14F mate with one another in an interleaving of fins to provide spaced-apart pairs of fins 13F and 14F. Disposed at least partially in alternating regions between fins 13F and 14F is at least one thermo-electric device 20. Accordingly, a plurality radially disposed thermo-electric devices 20 may be located in alternating gaps between fins 13F and 14F. Between combinations of fins 13F, 14F and at least one thermo-electric device 20 are gaps 21. Gaps 21 provide thermal conductivity separation regions between such combinations for channeling thermal exchange between manifold 13 and manifold 14.

Figure 2A:
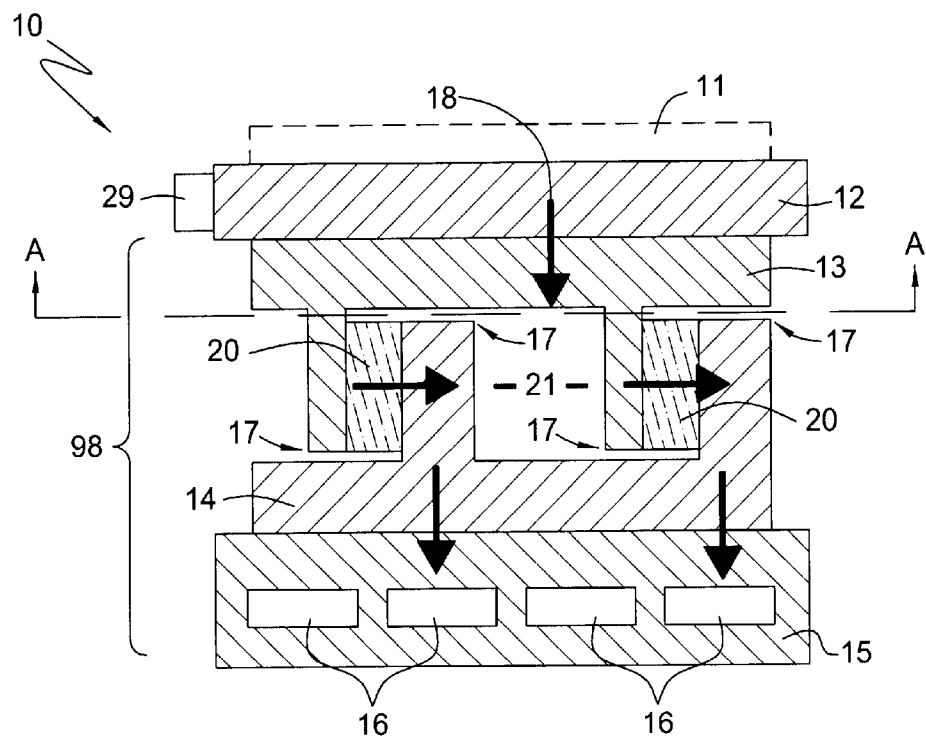
FIGS. 2A through 2C (collectively referred to as FIG. 2) depict cross-sectional views of an exemplary portion of an embodiment of a thermal exchanger assembly in accordance with aspects of the present invention.
Figure 2B:
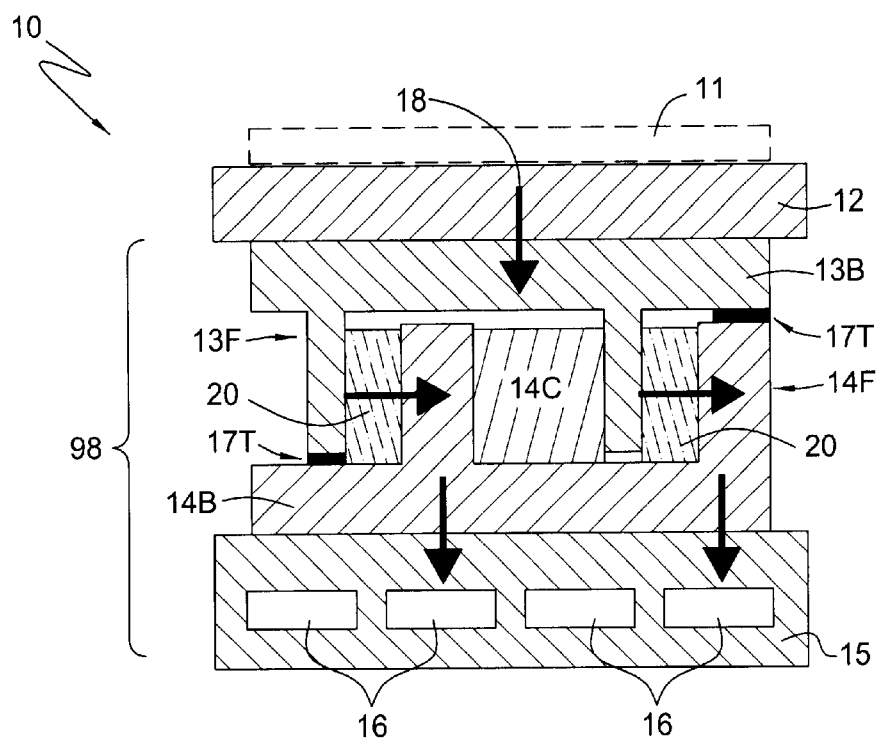
Figure 2C:
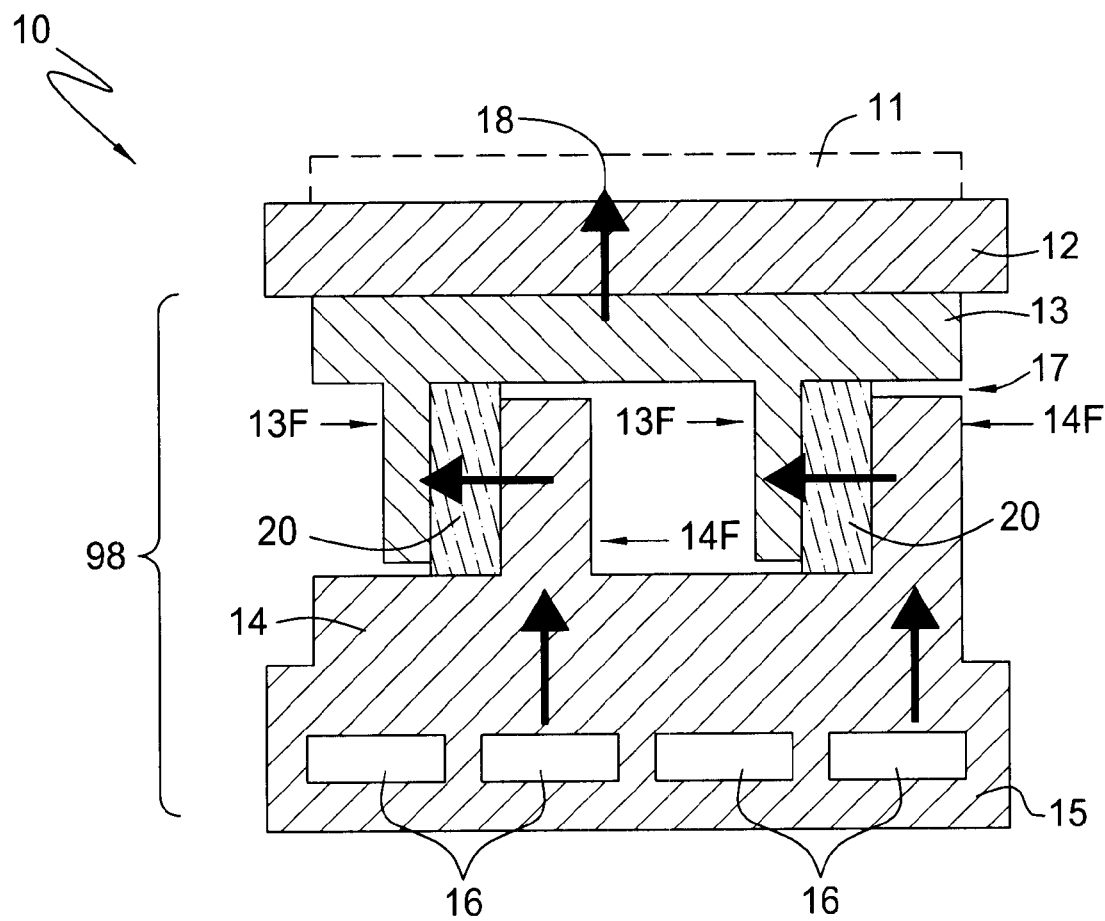

Thermo-electric device 20 may be sufficiently tall to prevent manifolds 13 and 14 from touching one another, as illustratively shown in FIG. 2C; otherwise, manifolds 13 and 14 may be in direct thermal communication and thermal energy channeling through thermo-electric devices 20 would quantitatively be reduced. Because of such height of thermo-electric devices 20, gaps 17 form between base member portions of manifolds 13 and 14 and upper fin portions of fins 14F and 13F, respectively, separating manifolds 13 and 14 from touching one another. Gaps 17 may be considered as a portion of gaps 21. However, having thermo-electric devices 20 sufficiently tall to prevent manifolds 13 and 14 from touching may provide an unwanted thermal conduction path longitudinally through thermo-electric devices 20. Accordingly, thermo-electric devices 20 in this embodiment should have thermal insulation at distal longitudinal ends. Arrows 18, in FIG. 2C, illustratively show a thermal conduction path for heating platen 12 and thus heating wafer 11. Arrows 18, in FIG. 2B, illustratively show a thermal conduction path for removing heat from platen 12 and thus cooling platen 12 and in turn wafer 11.

In FIG. 2B and in FIG. 2A, thermo-electric devices 20 are not so tall as to prevent direct contact between manifolds 13 and 14. Temporary spacers 17T may be used for positioning manifold 13 with respect to manifold 14, and later those temporary spacers 17T may be removed.

Figure 3:
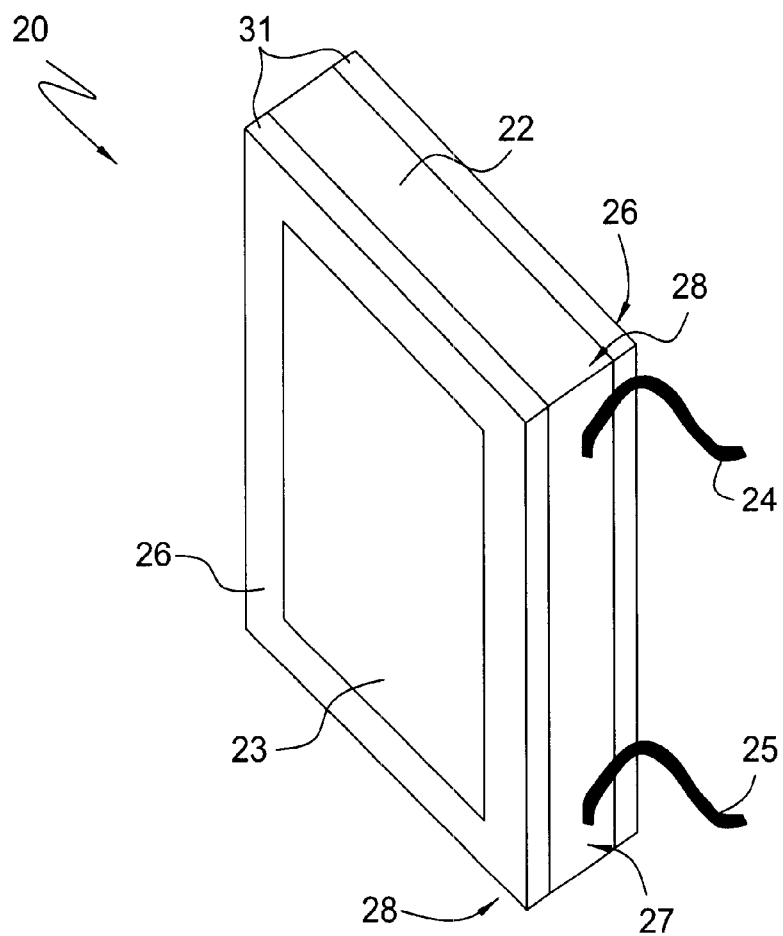
FIG. 3 depicts a perspective view of a thermo-electric device that may be used in the thermal exchanger assembly of FIG. 2.
Figure 3A:
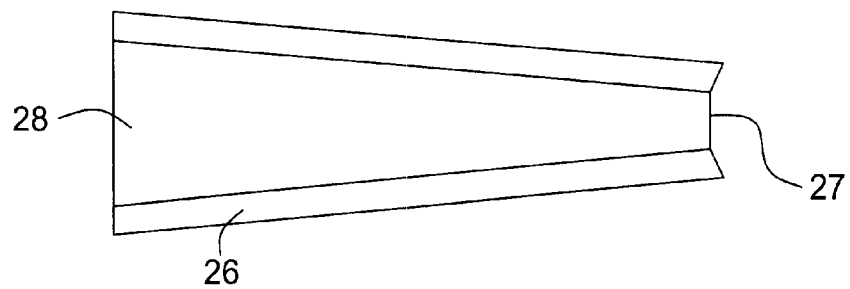
FIG. 3A depicts a surface plan view of an alternate embodiment of the thermo-electric device of FIG. 3.

Referring to FIG. 3, there is illustratively shown a perspective view of thermo-electric device 20. Thermo-electric device 20 comprises plates 31 and Peltier device 22. Peltier device 22 may be coupled to a power supply via wires 24 and 25. Thermo-electric device 20 has upper and lower surfaces 28, side surfaces 26, and inner surface 27. Thermally conductive material 23 is disposed on side surfaces 26. Thermally conductive material 23 may be selected from a thermally conductive adhesive or a brazing alloy. With respect to a brazing alloy, a brazing foil may be used. Such a brazing foil may be pressure sensitive so less temperature is needed to braze thermo-electric device 20 to fins 13F and 14F. A suitable brazing alloy may comprise indium. Thermo-electric device 20 may be shaped for radial disposition, as is illustratively shown in the top view of FIG. 3A.

Figure 4:
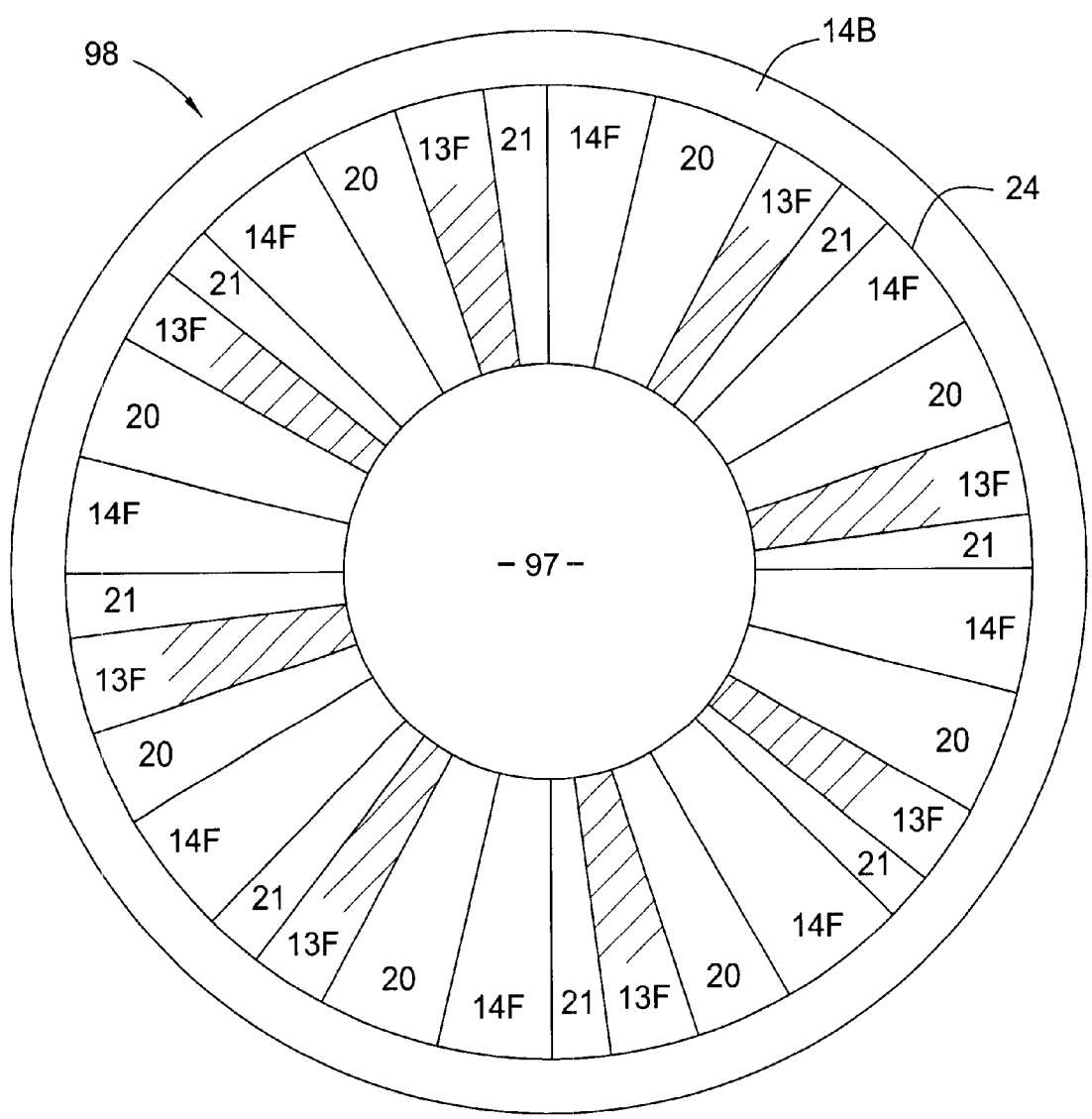
FIG. 4 depicts a plan and cross-sectional view illustrating radial positioning of an exemplary portion of the thermal exchanger assembly of FIG. 2.

Referring to FIG. 4, there is illustratively shown a cross-sectional and top plan view of an exemplary portion of thermal exchanger assembly 98. As illustratively shown, fins 13F, gaps 21, fins 14F, and thermo-electric devices 20 alternate in sequence and are radially disposed on or over manifold base 14B. Thermo-electric devices 20 may be wired together, as illustratively shown with respect to wire 24. Alternatively, tubular core 14C, shown in FIG. 4A, may be disposed in region 97 of manifold base 14B.

Figure 4A:
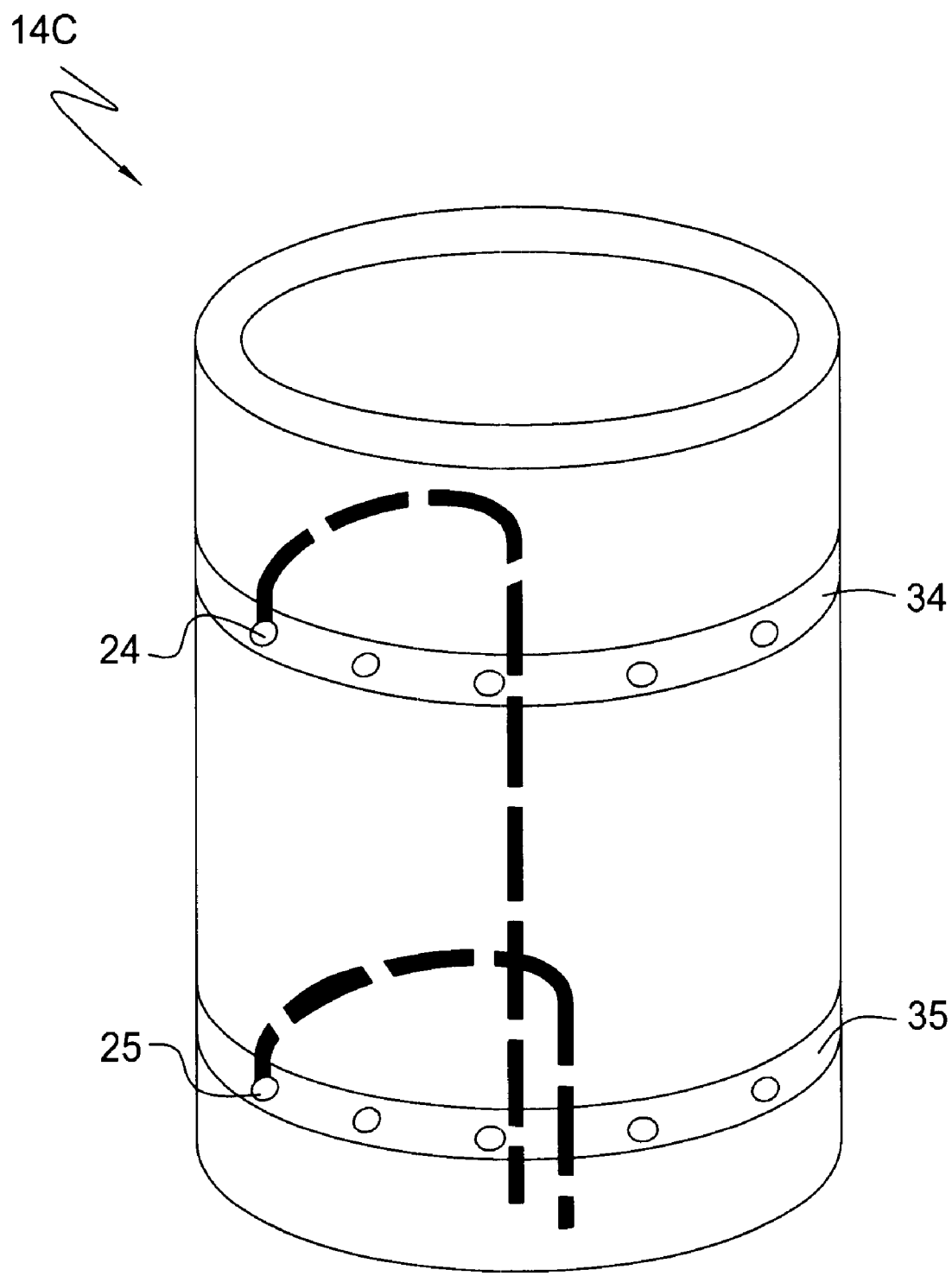
FIG. 4A depicts a perspective view illustrating electrical connections for an exemplary portion of the embodiment of the thermal exchanger assembly of FIG. 2C.

Referring to FIG. 4A, there is illustratively shown a perspective view of tubular core 14C. Tubular core 14C comprises conductive rings 34 and 35. Electrical contacts 24 and 25 of thermo-electric devices 20 may be put in contact with an exterior surface of conductive rings 34 and 35, respectively, and wires 24 and 25 may be in contact with an interior surface of conductive rings 34 and 35 for electrical connection to a power supply.

Although several preferred embodiments, which incorporate the teachings of the present invention, have been shown and described in detail, those skilled in the art can readily devise many other varied embodiments that still incorporate these teachings.

What is claimed is:

1. A thermal exchanger assembly for a wafer chuck assembly, comprising:
   a first manifold having a first set of radially positioned fins;
   a second manifold having a second set of radially positioned fins;
   the first set of radially positioned fins and the second set of radially positioned fins configured to interleave with one another to provide spaced-apart pairs of fins; and
   at least one thermo-electric device alternately located between and in thermal communication with the pairs of fins.

2. The thermal exchanger assembly of claim 1, wherein the at least one thermo-electric device comprises a Peltier device.

3. The thermal exchanger assembly of claim 1, further comprising a third manifold, the third manifold formed with at least one conduit having an inlet and an outlet configured for transporting a thermal medium in and out of the third manifold.

4. The thermal exchanger assembly of claim 1, wherein the second manifold is formed with at least one conduit having an inlet and an outlet configured for transporting a thermal medium in and out of the second manifold.

5. The thermal exchanger assembly of claim 1, wherein the at least one thermo-electric device is electrically coupled to a power supply.

6. An apparatus for a wafer chuck assembly, comprising:
   a platen;
   a first manifold in thermal communication with the platen, the first manifold having base and a first set of radially positioned fins extending from the base;
   a second manifold having a base and a second set of radially positioned fins extending from the base;
   the first set of radially position fins and the second set of radially positioned fins configured to interleave with one another to provide spaced-apart pairs of fins;
   at least one thermo-electric device alternately located between and in thermal communication with the pairs of fins; and
   a thermally conductive material located between the at least one thermo-electric device and each fin of the pairs of fins in thermal communication with the thermo-electric device, the thermally conductive material for attaching the pairs of fins to the at least one thermo-electric device.

7. The assembly of claim 6, further comprising a third manifold in thermal communication with the second manifold, the third manifold formed with a plurality of conduits for transporting a liquid.

8. The assembly of claim 7, wherein the second manifold comprises a tubular core, the tubular core comprising conductive rings configured for electrical contact with at least one thermo electric device.

9. The assembly of claim 8, further comprising a thermocouple in thermal communication with the platen.

10. The assembly of claim 9, wherein the thermally conductive material is a thermally conductive adhesive.

11. The assembly of claim 9, wherein the thermally conductive material is a braze alloy.

12. The assembly of claim 9, wherein the thermally conductive material is a foil comprising indium.

13. A semiconductor processing system, comprising:
   a chamber;
   a wafer chuck assembly at least partially located within the chamber, the wafer chuck assembly comprising:
     a platen;
     a first manifold in thermal communication with the platen, the first manifold having base and a first set of radially positioned fins extending from the base;
     a second manifold having a base and a second set of radially positioned fins extending from the base;
     the first set of radially position fins and the second set of radially positioned fins configured to interleave with one another to provide spaced-apart pairs of fins;
     at least one thermo-electric device alternately located between and in thermal communication with the pairs of fins;
   a thermo-couple in thermal communication with the wafer chuck assembly;
   a power supply electrically coupled to the at least one thermo-electric device; and
   a controller operatively coupled to the thermo-couple and to the power supply, the controller configured to regulate the power supply in response to temperature sensed by the thermo-couple.

14. The system of claim 13, further comprising:
   a third manifold in thermal communication with the second manifold, the third manifold formed with conduits for transporting a liquid; and
   a pump and reservoir coupled to conduits of the third manifold for circulating the liquid.

15. The system of claim 14, further comprising a radio frequency source electrically coupled to the wafer chuck assembly.

16. The system of claim 14, further comprising:
   a showerhead at least partially disposed within the chamber; and
   a radio frequency source electrically coupled to the showerhead.

17. The system of claim 14, further comprising:
   a vacuum system coupled to the chamber for removing gas; and
   at least one gas source coupled to the chamber for providing gas thereto.

18. The system of claim 13, further comprising:
   a third manifold in thermal communication with the second manifold, the third manifold formed with conduits for transporting a liquid;
   a pump and reservoir coupled to conduits of the third manifold for circulating the liquid;
   a first radio frequency source electrically coupled to the wafer chuck assembly;
   a showerhead at least partially disposed within the chamber;
   a second radio frequency source electrically coupled to the showerhead;

a vacuum system coupled to the chamber for removing gas; and at least one gas source coupled to the chamber for providing gas thereto.

19. The system of claim 18, further comprising a chiller operatively coupled to the pump and reservoir for providing the liquid thereto.

20. A method of processing a semiconductor wafer, comprising:

locating the semiconductor wafer on a wafer chuck assembly in a chamber, the wafer in thermal communication with a platen of the wafer chuck assembly; and cooling the platen by supplying an electrical current to at least one thermo-electric device located in the wafer chuck assembly, the at least one thermo-electric device radially disposed between fins of respective upper and lower manifolds.

21. A method of processing a semiconductor wafer, comprising:

locating the semiconductor wafer on a wafer chuck assembly in a chamber, the wafer in thermal communication with a platen of the wafer chuck assembly; and heating the platen by supplying an electrical current to at least one thermo-electric device located in the wafer chuck assembly, the at least one thermo-electric device radially disposed between fins of respective upper and lower manifolds.

* * * * *